United States Patent [19]

Cluff

[11] Patent Number: 4,771,764
[45] Date of Patent: Sep. 20, 1988

[54] WATER-BORNE AZIMUTH-ALTITUDE TRACKING SOLAR CONCENTRATORS

[76] Inventor: C. Brent Cluff, 310 W. Camino Fairhaven, Tucson, Ariz. 85704

[21] Appl. No.: 597,643

[22] Filed: Apr. 6, 1984

[51] Int. Cl.$^4$ ................................................ F24J 3/00
[52] U.S. Cl. ...................................... 126/440; 126/425; 126/438
[58] Field of Search ............... 126/440, 424, 425, 438, 126/439

[56] References Cited

U.S. PATENT DOCUMENTS

| | | | |
|---|---|---|---|
| 1,101,001 | 6/1914 | Willsie | 126/440 X |
| 1,683,266 | 9/1928 | Shipman | 126/440 X |
| 1,946,184 | 2/1934 | Abbot | 126/443 |
| 3,125,091 | 3/1964 | Sleeper, Jr. | 126/440 X |
| 3,321,012 | 5/1967 | Hervey | 165/40 |
| 3,924,604 | 12/1975 | Anderson | 126/438 X |
| 3,929,121 | 12/1975 | Rogers | 126/440 |
| 4,000,734 | 1/1977 | Matlock | 126/271 |
| 4,148,301 | 4/1979 | Cluff | 126/271 |
| 4,150,663 | 4/1979 | Sisson | 126/438 |
| 4,159,629 | 7/1979 | Korr et al. | 126/438 X |
| 4,203,426 | 5/1980 | Matlock et al. | 126/438 X |
| 4,227,511 | 10/1980 | Margen et al. | 126/440 X |
| 4,296,731 | 10/1981 | Cluff | 126/424 |
| 4,315,500 | 2/1982 | Gonder | 126/438 X |

Primary Examiner—Larry Jones
Attorney, Agent, or Firm—Warren F. B. Lindsley

[57] ABSTRACT

A water-borne tracking solar energy collecting and converting system employing multiple lens collectors for redirecting sunlight for concentration on photovoltaic cells.

1 Claim, 6 Drawing Sheets

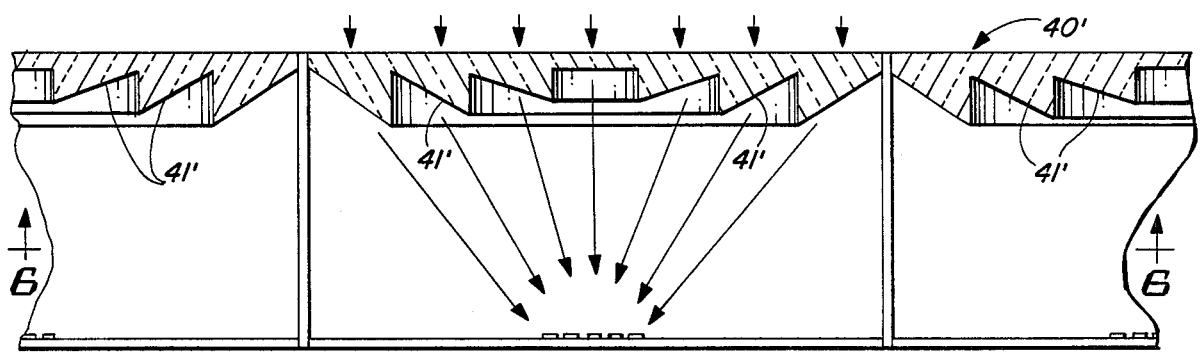
Fig-5
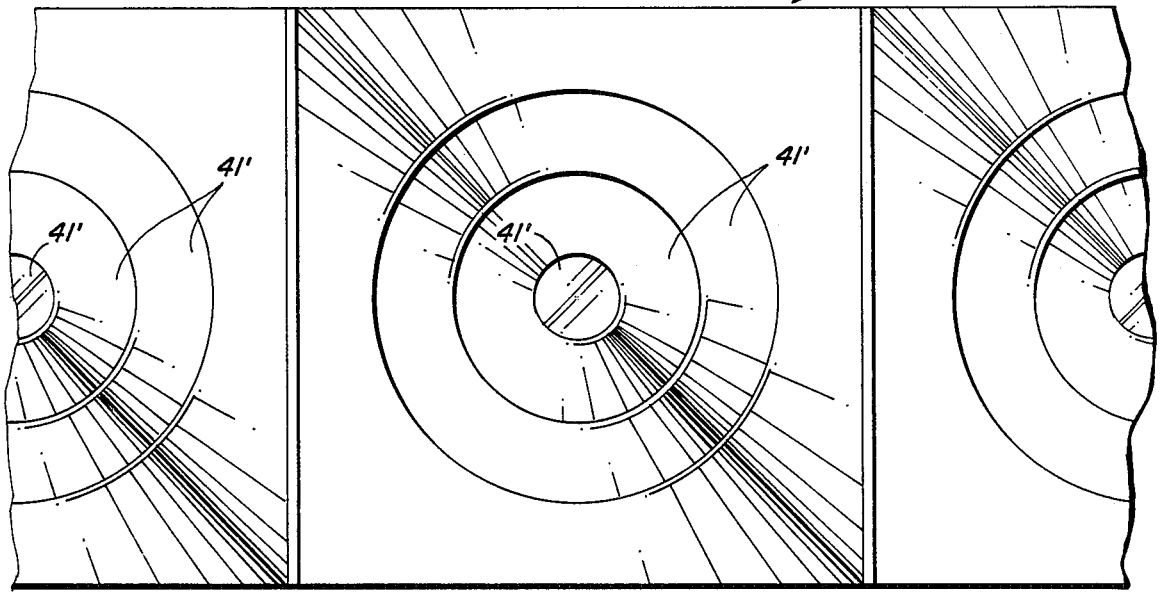
Fig-6
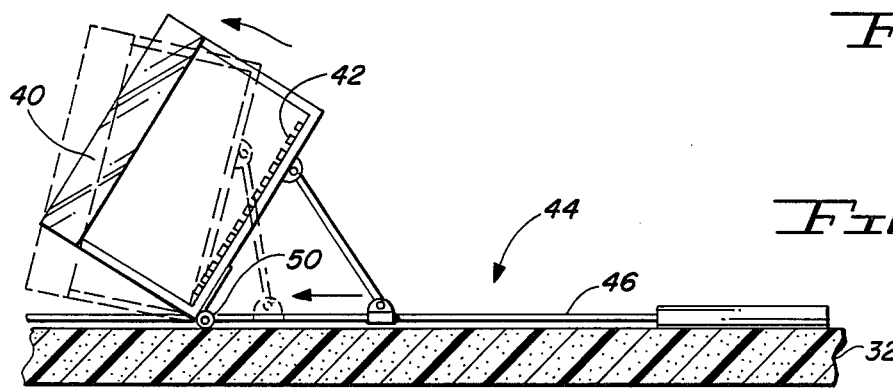
Fig-7
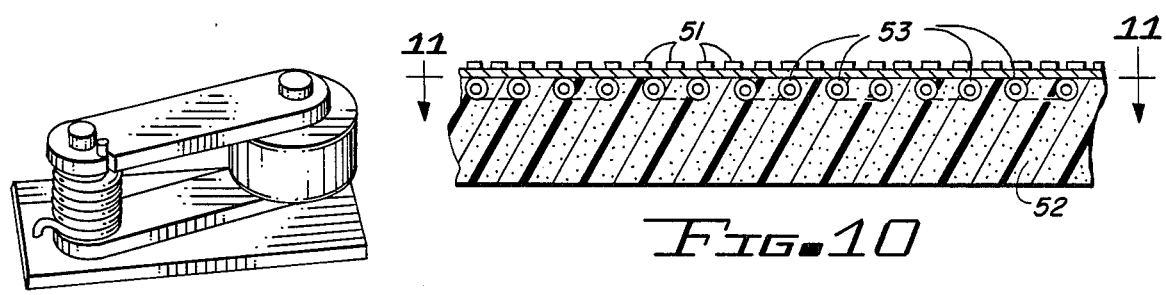
Fig-8
Fig-10

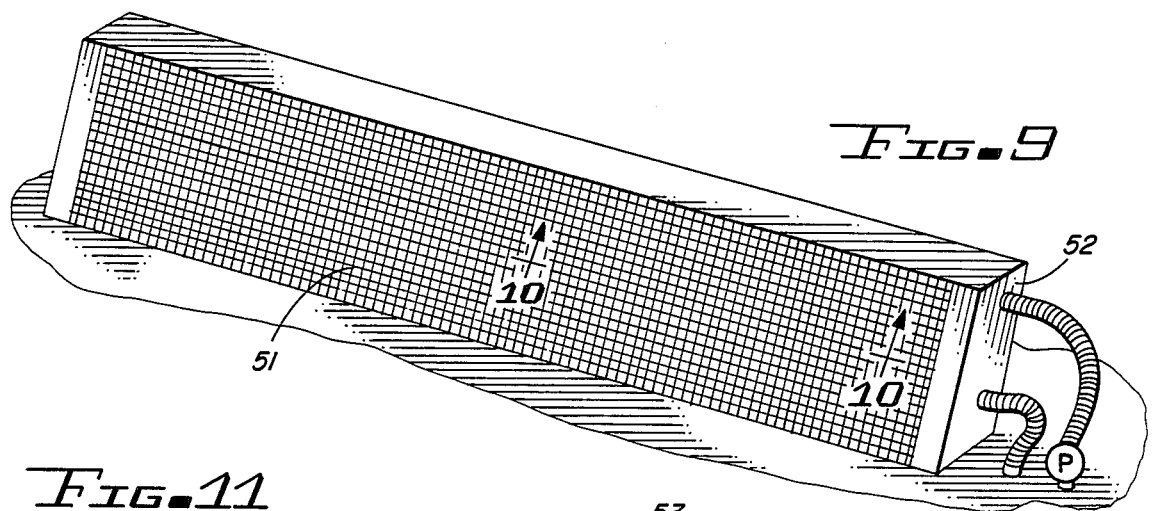
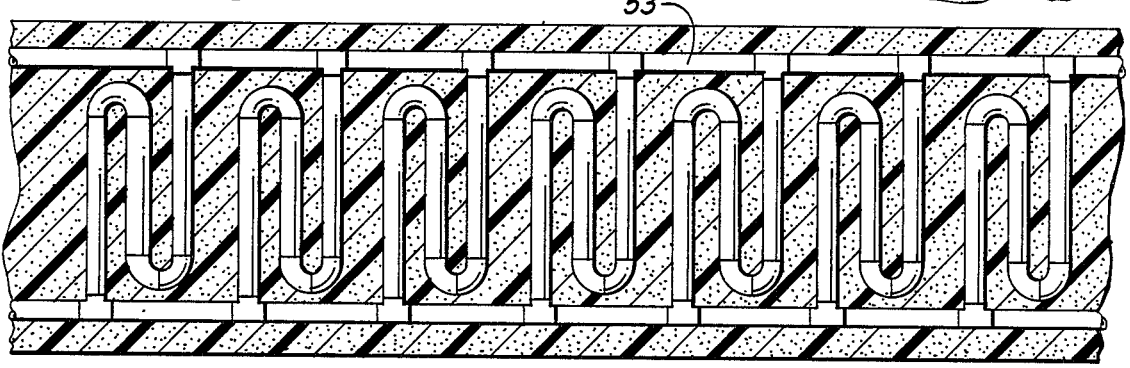
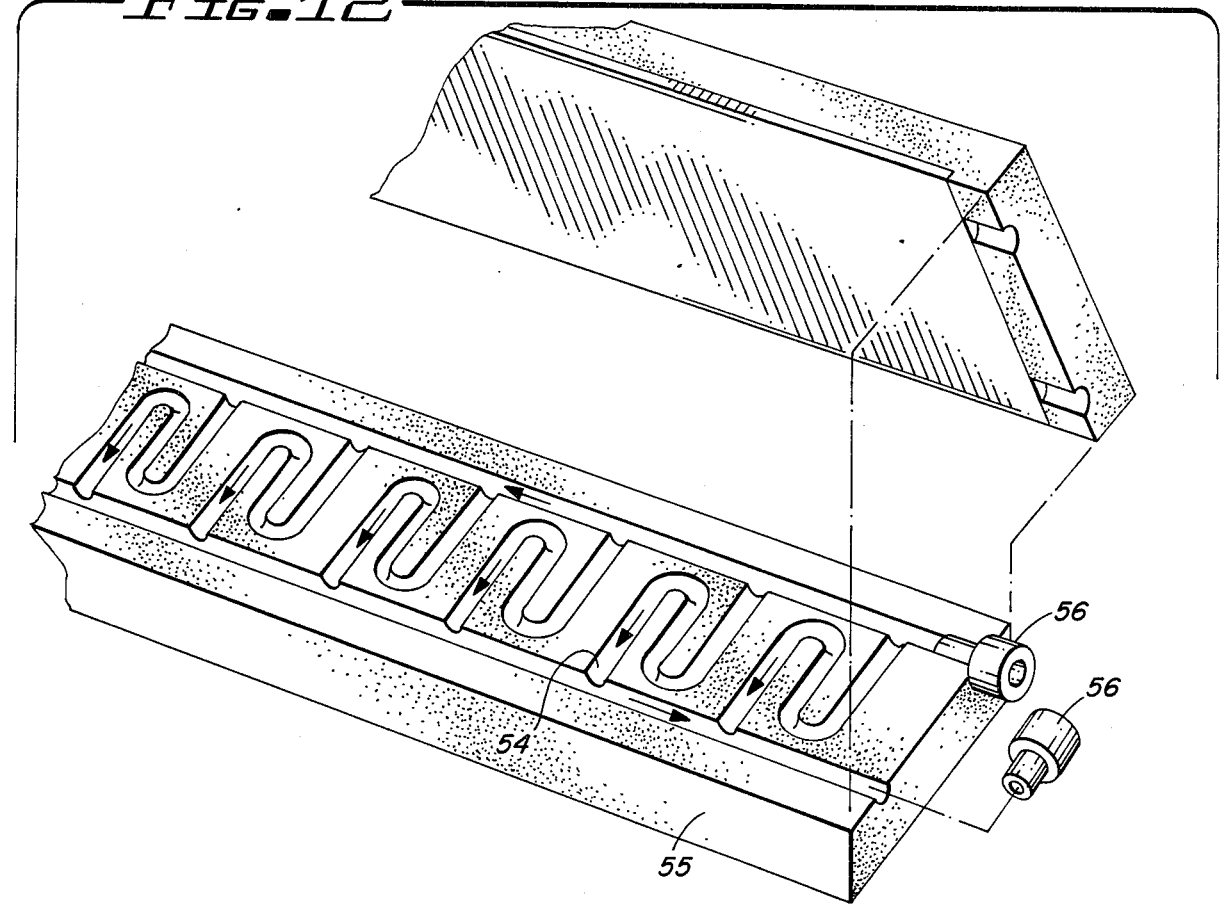

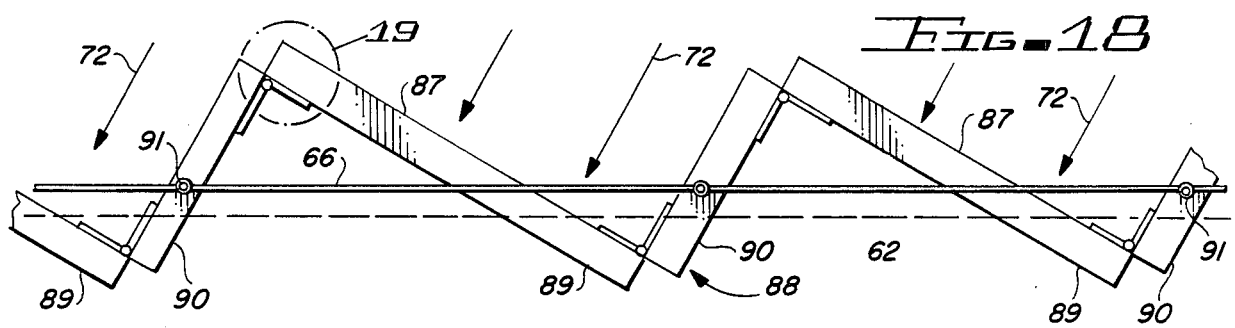
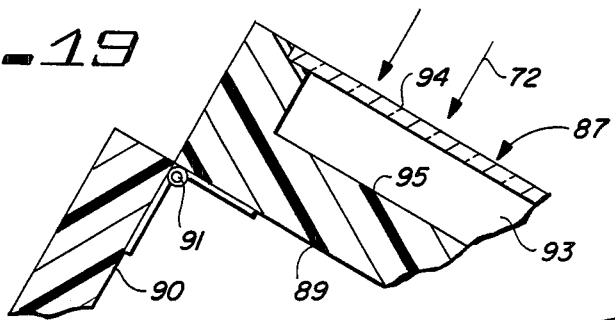
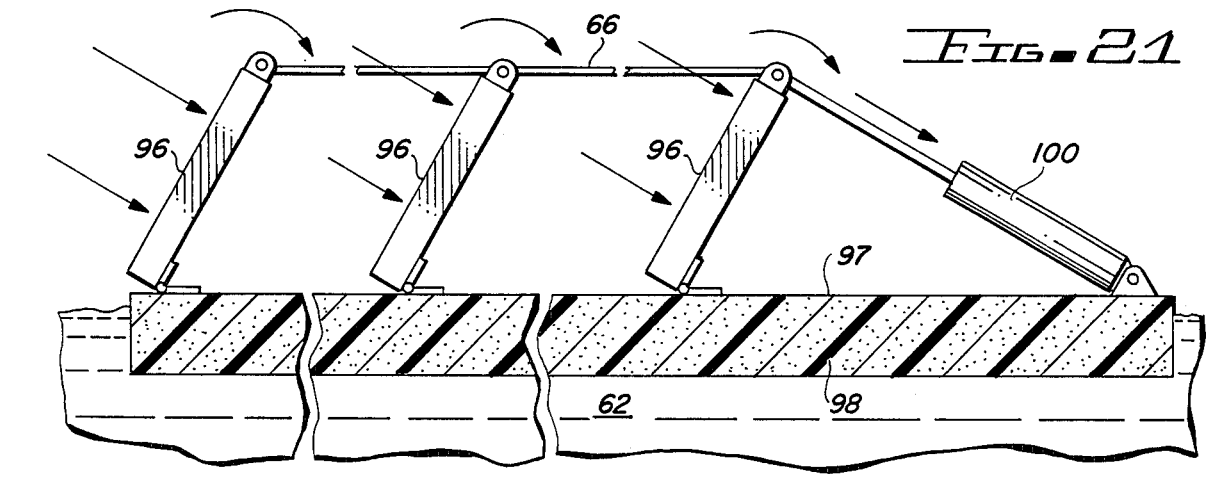

WATER-BORNE AZIMUTH-ALTITUDE TRACKING SOLAR CONCENTRATORS

BACKGROUND OF THE INVENTION

This invention relates to a water-borne solar energy collecting, concentrating and converting apparatus employing both an azimuth and a dual purpose azimuth-altitude tracking system.

DESCRIPTION OF THE PRIOR ART

Parabolic or cylindrical reflectors have been utilized in the past along with sun-tracking mechanisms in connection with various schemes for the collection, conversion and utilization of solar energy. U.S. Pat. No. 4,000,734 is descriptive of this type of equipment.

Heat exchangers or solar energy concentrators, particularly of the type adapted to collect cold or heat, have been constructed either with a series of tubes embedded in a flat black metallic surface or have comprised a curved or semi-cylindrical or parabolic reflector with a blackened tube mounted at approximately its focal point with U.S. Pat. Nos. 1,946,184 and 3,321,012 being representative thereof. Relative to this latter form of the prior art, fins or vanes have been mounted about the tube in an effort to obtain more efficiency from the unit. The back side of the tube is generally insulated to reduce energy losses.

U.S. Pat. No. 4,148,301 discloses a water-borne solar energy collecting and converting system employing an azimuth-tracking, floating platform equipped with reflectors and associated thermal collector tubes.

U.S. Pat. No. 4,296,731 discloses a waterborne tracking solar energy collecting and converting system employing booster and multiple mirror concentrator collectors for concentrating sunlight on either photovoltaic cells and/or flat plate collectors.

At best, the prior art solar concentrating collectors have needed an elaborate system of gears and racks or other means to shift or otherwise change the positions of the exchange or collector unit used so that its relative position to the sun will remain constant.

While such prior art inventions do suggest a workable approach for tracking the sun, the particular implementations described in these patents have in general fallen short of what is required in a low cost and practical system.

SUMMARY OF THE INVENTION

In accordance with the invention claimed, new and improved solar energ collecting and converting apparatus and systems have been provided which are compact and inexpensive by virtue of their unique sun-tracking and solar collector mechanisms which significantly improve the efficiency of both conventional flat plate and concentrating collectors.

It is, therefore, one object of this invention to provide improved tracking both altitude and azimuth for dual tracking lens concentrating solar collectors mounted on a floating platform.

Another object of this invention is to provide a simplified way of azimuth tracking so that a continuous array of booster lenses can be focused on alternate rows of either photovoltaic or flat plate collectors.

Another object of this invention is to provide a new and improved compact, low profile inexpensive floatable, dual tracking solar energy collecting system. This system periodically moves a bank of solar collectors mounted thereon in an arcuate path while orienting the sun's path to maintain the reflectors in a plane containing the sun's center, thus collecting the maximum energy possible.

Another object of this invention is to provide a new structure and method using a unique low profile multiple absorber and redirector for collecting more solar energy at a lower cost than has heretofore been feasible.

A further object of this invention is to provide an inexpensive solar energy collector which achieves maximum energy collection throughout every day of the year by virtue of its effective yet inexpensive solar collector mounting, tracking and converter moving mechanism.

A still further object of this invention is to provide improved dual tracking floatable mounted booster and concentrating collector systems that provide uniform concentrated sunlight over photovoltaic cells.

A still further object of this invention is to provide a solar collector that provides a dual focusing arrangement for concentrating and redirecting the solar rays.

Further objects and advantages of the invention will become apparent as the following description proceeds and the features of novelty which characterize this invention will be pointed out with particularity in the claims annexed to and forming a part of this specification.

BRIEF DESCRIPTION OF THE DRAWINGS

The present invention may be more readily described by reference to the accompanying drawings, in which:

FIG. 5 is a cross-sectional view of a modification of the flat surface solar absorber shown in FIG. 2;

FIG. 6 is a view of FIG. 5 taken along the line 6—6;

FIG. 7 is a partial perspective view of the floating platform shown in FIG. 1 taken along the line 7—7;

FIG. 8 is an enlarged perspective view of the spring biased platform guiding roller shown in FIG. 1;

FIG. 9 discloses a platform mounted solar collector employing a surface mounted array of photovoltaic cells that can be substituted for the multiple collector shown in FIG. 1;

FIG. 10 is a cross-sectional view of FIG. 9 taken along the line 10—10;

FIG. 11 is a cross-sectional view of FIG. 10 taken along the line 11—11;

FIG. 12 is a partial exploded view of the structure shown in FIG. 9 modified to employ a different cooling system;

FIG. 18 is a partial cross-sectional view of a plurality of independently floatable altitude tracking flat plate solar collectors interconnected for mounting on water surfaces as an integrated semi-rigid unit;

FIG. 19 is an enlargement of the circled area of FIG. 18;

FIG. 20 is a top view of FIG. 13;

FIG. 21 is a cross-sectional view of FIG. 20 taken along the line 21—21 illustrating the collector panel actuating means;

DESCRIPTION OF THE PREFERRED EMBODIMENT

Figure 1:
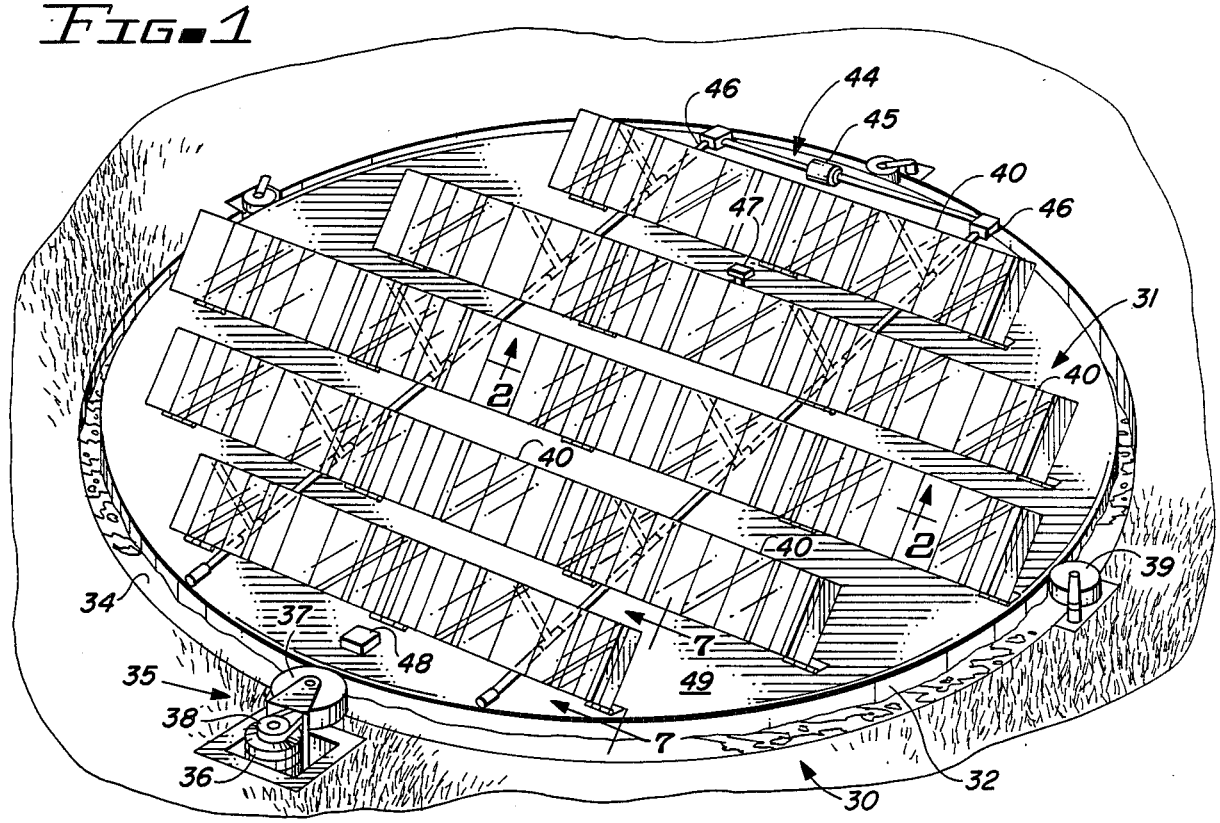
FIG. 1 is a perspective view of an azimuth tracking floating platform array of altitude tracking multiple solar energy collectors.

Referring more particularly to the drawings by characters of reference, FIGS. 1—8 disclose a solar energy collection and conversion apparatus or system 30 utilizing an array 31 of absorbers supported on a rotating or arcuately movable floating platform 32.

The array comprises a multiplicity of planarly arranged flat plate solar lenses 33 that redirect the solar rays to suitable collectors that are mounted on a platform or in a frame so as to be pivotally movable to follow the sun.

The floating platform 32 may be constructed and placed on a shallow pool of water such as a contained pool 34 or it can be placed on any body of water regardless of its size. A tracking and platform moving mechanism 35 shown in FIGS. 1 and 8 comprising a suitable motor 36 and drive roller 37 connected to motor 36 through a pulley mechanism 38 is utilized to track the sun and move the platform azimuthally each day.

As noted from FIG. 1, the platform is driven by a drive roller 37 connected to motor 36 and held in the middle of the pool by a plurality of spring biased driven rollers 39. The drive roller rotates the platform by frictionally engaging the peripheral edge of the platform and rotating it upon rotation of the drive roller. U.S. Pat. Nos. 4,148,301 and 4,296,731 show various platform driving means which are embodied herein by reference.

Platform 36 may be formed of any suitable floatable material such as, for example, the expanded polystyrene, wax impregnated material described in U.S. Pat. 4,079,170 and 4,148,301 incorporated herein by reference. The platform can also be made of modular interconnecting panels constructed of closed cell foam such as styrofoam laminated with fiberglass and resin. The foam panels could be reinforced with plastic, wooden or metal struts prior to being laminated with fiberglass and resin. For colder regions subject to freezing, the bottom of the platform could be constructed so to be smooth in order that tracking could continue using ice as the supporting media when the reservoir was frozen. Alternately freezing could be prevented by adding waste heat to the pool or using an antifreeze type chemical additive. The platform could also be constructed using reinforced concrete in specially grooved close celled foam. Any exposed foam areas could be coated with reinforced cement coating. A patent application, Ser. No. 560,523, entitled Structural Components Employing Insulating Moisture Barriers and Reinforcing Concrete Interacting Overlayers, filed Dec. 12, 1983, embodied herein by reference, has been applied for by the applicant of this invention.

The array 31 of lenses shown in FIG. 1 each comprise a focusing flat plate collector panel 40 hingedly mounted on platform 33 and focused by a moving mechanism for collecting solar energy and together with the platform moving mechanism 35, provides the dual function of collecting the sun's energy, as shown in U.S. Pat. No. 4,296,731.

One of the basic problems inherent in maximizing the efficiency of any solar collector is that of tracking the sun. This is particularly true of focusing collectors. Flat plate collectors are placed in a fixed position either horizontally or inclined toward the equator. Even though the efficiency of the flat plate collector could be increased significantly, heretofore the costs of providing such a tracking mechanism using known land supported mechanism has been prohibitive.

This problem of tracking the sun is greatly reduced when the collectors are mounted on a floating platform as disclosed herein. Only a small amount of force is needed whether the raft or platform is floated in a confined pool or on open water.

Figure 2:
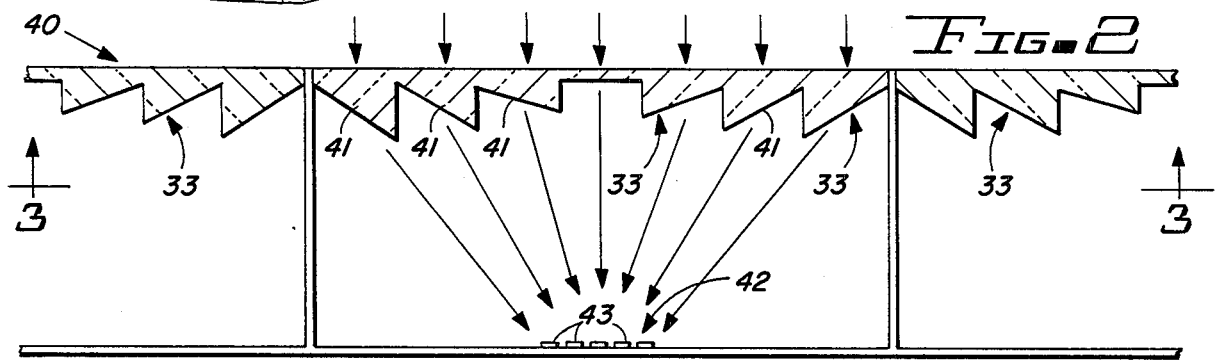
FIG. 2 is a cross-sectional view of FIG. 1 taken along the line 2—2.
Figure 3:
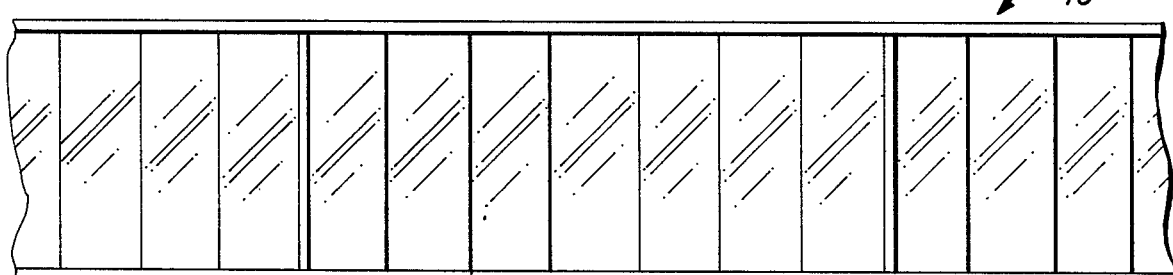
FIG. 3 is a cross-sectional view of FIG. 2 taken along the line 3—3.
Figure 4:
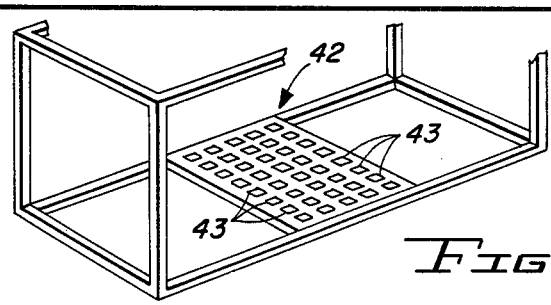
FIG. 4 is an enlarged perspective view of one of the photovoltaic mounted collector panels shown in FIG. 2.

FIGS. 1 and 2 illustrate a flat multiple plate azimuth tracking solar panel 40, a plurality of which are parallelly arranged on the floating platform 32. Each panel lens is formed with a flat surface on the top. On its bottom side, fixed sloping surfaces 41 are positioned to deflect the sun's rays downwardly onto one or more collector panels 42. It should be noted that these surfaces 41 may be of different widths and slopes to accomplish their purpose. In this type of tracking, the panels are kept pointed in the direction of the sun by the azimuth tracking function of the moving mechanisms 35 and altitude tracking function of the moving mechanism.

It should be noted that a moving mechanism 44 for the panels 40 may pivotally move these panels in any suitable manner. As shown in FIG. 1, a motor 45 rotates a pair of spaced screw means 46 which pivotally moves simultaneously all of the parallelly arranged panels depending upon a signal received from the altitude light sensing mechanism 47. This light sensing means, which is known in the art energizes the reversible motor 45 of the moving mechanism 44 in either direction depending on the sun's rays to keep the flat surfaces of lenses 33 of the panels perpendicular to the sun's rays. One sensor is needed per motor to sense the proper altitude array. In a similar way, the azimuth light sensing mechanism 48 activates the motor 36 in either azimuthal direction depending on the sun's rays through the use of the sensor to keep the reflective surfaces of the collectors perpendicular to the rays of the sun. Only one sensor and motor is needed to maintain the proper azimuthal orientation of the floating platform.

The multiple dual tracking collector employing a plurality of lens surfaces for redirecting the solar rays to a collector would have the advantage of concentrating a greater amount of sunlight per unit of collector panel than heretofore possible because the collector panels can be made wider than heretofore feasible without increasing its profile. The design of this type of collector panel is also a function of the distance of the collector panel 42 below the base of the sloping lens surfaces and the width and slope of the lens surface. FIGS. 1 and 2 depict a design in which a number of lenses are mounted on each side of an associated collector panel and these lenses remain in a fixed relation to the collector panel even when the panels are pivotally moved by the moving mechanisms 35 and 45 to follow the sun. The panel 40, for example, can be made of acrylic plastic. For large construction runs, molds can be used to produce the shaped panels, shown in FIG. 5.

The disclosed concept offers virtually unlimited options in construction as far as concentration ratios are concerned. The number of the redirecting surfaces of the lenses can easily be increased and the width of the surfaces reduced with a corresponding reduction in size of the receiving collector 42. Thus, the concentration can be increased. It should be relatively easy to reach up to 500° F. by adjusting this ratio provided care is taken in the design and construction of the collector panels.

As shown in FIG. 1-4, the collector panels 42 may be faced with photovoltaic cells 43 diagrammatically shown which are utilized for direct conversion of solar rays to electrical energy by concentrating sunlight on the cells. Since the photovoltaic cells are already in an enclosed box, additional covering of glass over the photovoltaic cells is not needed. A liquid can pass through cooling tubes mounted adjacent the surface on which the photovoltaic cells are mounted, well known in the art, at a rate high enough as needed to keep the temperatures of the cells below a specified amount. One way of accomplishing this is shown in FIGS. 10 and 11. Energy contained in liquid passing through the tubes can be collected and put to useful work. Thus, both electrical and thermal energy can be generated at the same time.

Floating collectors of this type can be set up on roofs of large buildings, on the ground near apartment complexes or in subdivisions. The reservoir on which the collector floats could be used as a storage of hot water for heating in the winter or cold water for cooling in the summer. The system would be connected to the building, apartments or individual homes through insulated pipelines. In the developed countries, any excess electrical energy could be sold back to the electrical utility in exchange for drawing on the electrical system when the sun was not shining. In areas where no other source of electricity is available, other types of electrical storage such as batteries or the storage of liquid pumped to an elevated position for later gravitational release would have to be used to provide a continuous power source.

The floating collector has considerable potential when used in conjunction with pumping for irrigation. The collector could be floated on a reservoir needed to even out water production at the same time eliminating evaporation. The system should be very appealing to the irrigator, due to its simplicity, particularly if photovoltaic cells are used. The floating collector can be used on a large scale on existing reservoirs in arid lands, in tideland or marshy areas.

As disclosed in the discussion of the array 31 of lenses in FIG. 1, each of the panels 40 are hingedly attached at one edge to the top surface 49 of the floating platform 32 so that suitable screws 46 attached thereto may pivotally move the panels 40 about their hinges 50 shown in FIG. 7 by means of the moving mechanism 44 to keep the flat surfaces of the lens in alignment with the sun as heretofore described.

FIGS. 5 and 6 illustrate that the solar panel 40' comprising the plurality of lenses 31 may be a unitary molded configuration having a plurality of fixed circular sloping surfaces 41' which would direct light to a circular area for higher concentration.

FIG. 7 illustrates one way of pivotally moving the panels wherein the panels are shown merely as a flat surface rather than a molded configuration, as shown in FIGS. 5 and 6. The flat plate panel arrangement of FIG. 9 may be substituted for the multi-lens array 31 shown in FIG. 1. The collector array shown in FIGS. 9 and 10 comprise a plurality of photovoltaic cells 51 which are supported on a support 52 which positions the photovoltaic cells at an optimum angle with the surface of the platform 32. This angle can be fixed, or adjusted seasonally or for maximum production tracked in an altitude mode. In this mode, the surface of the photovoltaic cells would always be perpendicular as far as possible to the rays of the sun.

FIGS. 10 and 11 also illustrate one way of arranging the cooling pipes 53 below the surface supporting the photovoltaic cells although other configurations may be used as long as the cells are properly cooled.

FIG. 12 illustrates an alternative arrangement for cooling the photovoltaic cells by forming passageways 54 in the base of the supporting platform 55. The ends of the passageways 54 of each platform 55 may be provided with pipe sections 56 for use in interconnecting with other similar platforms of like collector panels 42.

Figure 13:
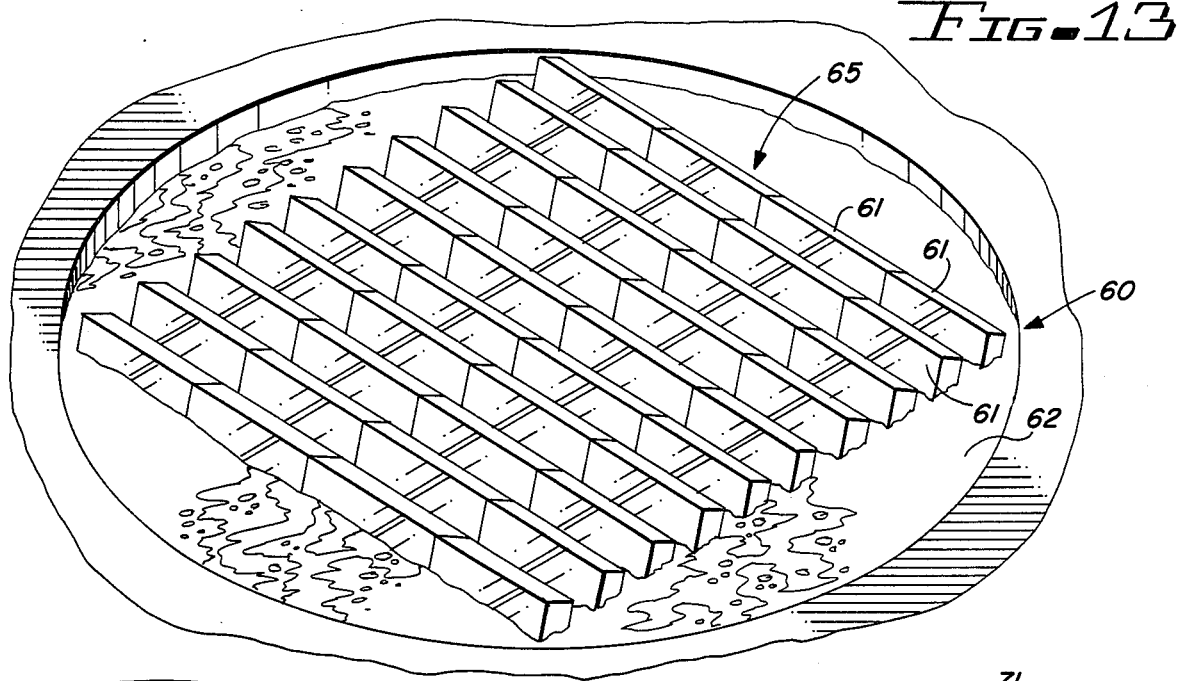
FIG. 13 is a perspective view of a plurality of individual spaced mounted, floating collectors that are pivotally movable around central axis and jointly movable for altitude adjustment.
Figure 14:
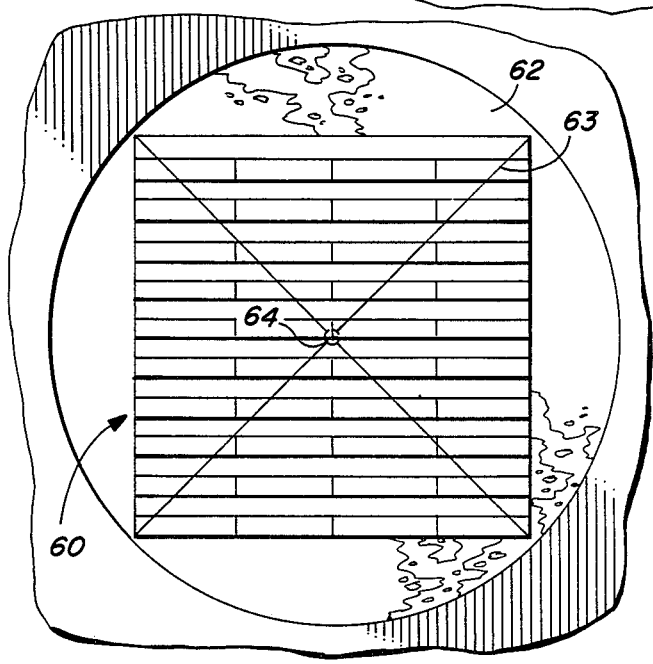
FIG. 14 is a top view of FIG. 13 showing the structural frame.

FIGS. 13 and 14 disclose a further modification of the inventive concept wherein a circular platform 60 is formed by a plurality of floating solar collectors 61 which individually float on the surface of a pond 62 and are interconnected by a system of connecting rods forming a main frame 63. Frame 63 is pivotally movable about a pivotal axis 64 for azimuth solar tracking purposes.

Figure 15:
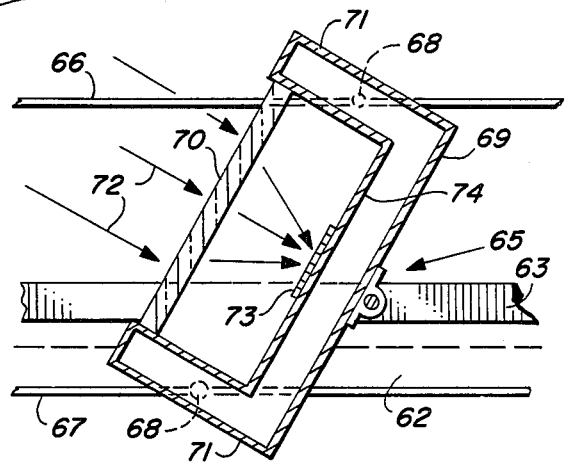
FIG. 15 is an enlarged cross-sectional view of one of the collector panels shown in FIG. 13 employing a fresnel type lens focusing light on photovoltaic cells.

As shown in FIG. 15, each of the solar collectors 61 which may be interconnected into a plurality of parallelly arranged panels 65 may be moved as a panel arrangement for fixed or altitude daily tracking purposes by a pair of adjustment rods 66 and 67 which are pivotally connected at 68 to the panels for pivotal movement in the manner shown in FIG. 15.

Each panel 65 is pivotally connected to the rods 66 and 67 for push-pull movement in a known manner. As shown in FIG. 13, the panels 65 must be spacedly arranged with enough open space therebetween so that the panels may be moved to and from a horizontal position without touching a juxtapositioned panel. As obvious, a horizontally arranged structural member should be provided on frame 63 against which the ends of the rods 66 and 67 are attached for stability purposes.

As shown in FIG. 15, panels 65 may comprise hollow elongated U-shaped trough 69 having a lens 70 covering the open space between legs 71 of the trough for receiving the solar rays 72 and a bank of photovoltaic cells 73 mounted on the bight 74 of the U-shaped configuration for receiving the redirected concentrated solar rays from lens 70.

Figure 16:
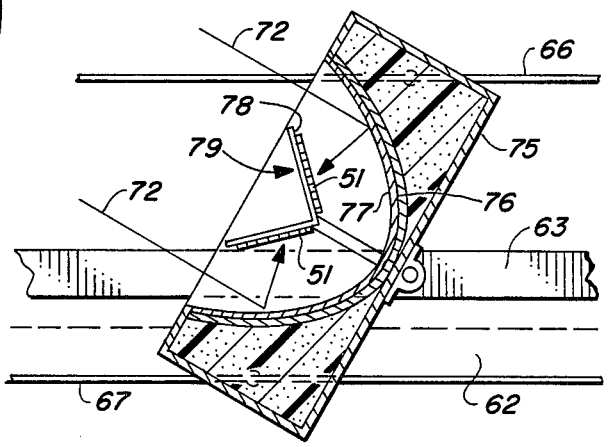
FIG. 16 is an enlarged cross-sectional view of a modification of the collector panel shown in FIG. 15.

FIG. 16 discloses a modification of the solar receiving panel shown in FIGS. 13-15 wherein the elongated trough 75 of the panel is formed to comprise a parabolic or arcuate surface 76, the surfaces of which may be covered with mirrors 77 positioned for redirecting rays 72 of the sun onto solar photovoltaic cells 51 formed on the bottom surface 78 of a V-shaped trough 79.

Figure 17:
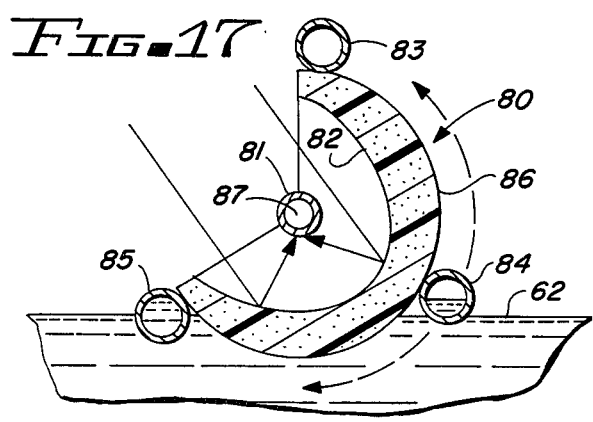
FIG. 17 is a cross-sectional view of a further modification of a water mounted solar collector panel which may be rotated by water flow through ballest pipes spacedly mounted around the periphery of the arcuate formed collector support.

FIG. 17 discloses a further modification of the elongated troughs 69 and 75 shown in FIGS. 15 and 16 wherein the arcuate trough 80 formed of metal or extruded plastic is pivotally mounted with a collector pipe 81 mounted within the focal axis of the reflective surface 82 of the arcuate shaped trough 80. The collector pipe 81 conducts water 82 therethrough to be heated by the rays of the sun in a known manner.

This embodiment differs from the others in that the trough which is floating on the surface of pond 62 is moved in an altitude manner by changing the level of the water placed in the ballest pipes 83, 84 and 85 which are spacedly secured to the outer periphery 86 of the trough in the manner shown in FIG. 17.

FIGS. 18 and 19 disclose a further modification of the inventive concept disclosed herein which illustrate a plurality of flat plate collectors 87 mounted on a frame, such as frame 63, which is pivotally mounted for azimuth tracking purposes, as heretofore described, with rods or cables, such as rods 66 and 67 being connected to incline or decline the collectors 87 for altitude tracking purposes.

The collectors 87 are mounted on a frame 88 comprising a plurality of hingedly connected parts 89, 90 with one part, such as part 90, of each section being pivotally connected at 91 to rod or cable 66. The solar collectors can be pivotally positioned on a frame 63 for azimuth tracking purposes around a pivotal axis 92, as heretofore explained.

FIG. 19 further illustrates that the collector 87 may comprise a hollow trough 93 covered by a glass or lens 94 for directing solar rays 72 through the lens onto photovoltaic cells 43 to be positioned on the bottom 95 of trough 93 in the usual manner.

FIGS. 20 and 21 illustrate a further modification of a raft mounted solar collector tracking arrangement wherein a plurality of collectors 96 either concentrating or flat plate are hingedly mounted on the top surface 97 of a water mounted raft 98 for altitude movement. The top surface of each collector is pivotally connected to a push-pull rod or cable 99 which is connected to a suitable moving mechanism 100. Raft 98 may be pivotally movable about its center for azimuth tracking in the manner heretofore disclosed.

Figure 22:
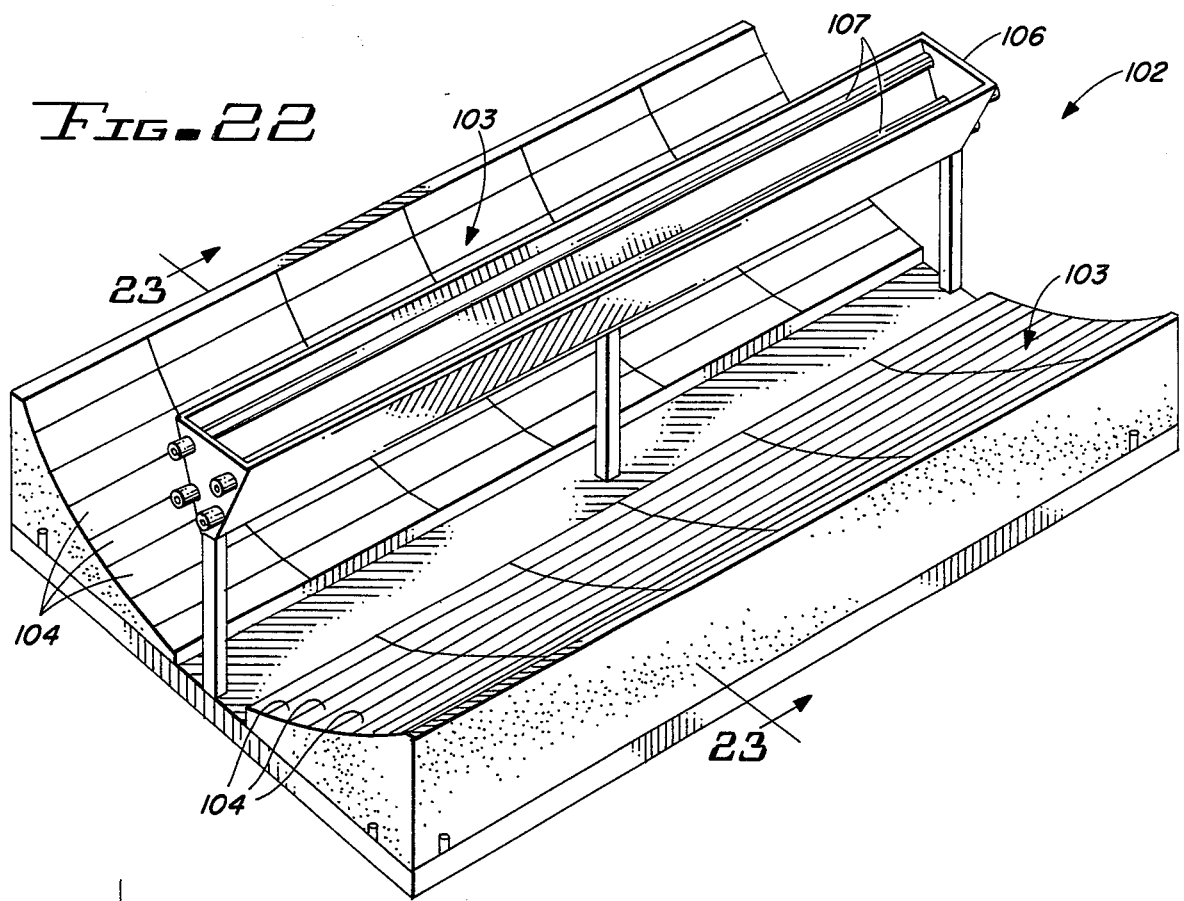
FIG. 22 is a perspective view of a further modification of the collector assemblies shown in FIGS. 1-21 comprising a floating platform formed to provide a parabolic surface covered with a mirror surface which directs the solar rays to water cooled photovoltaic panels.
Figure 23:
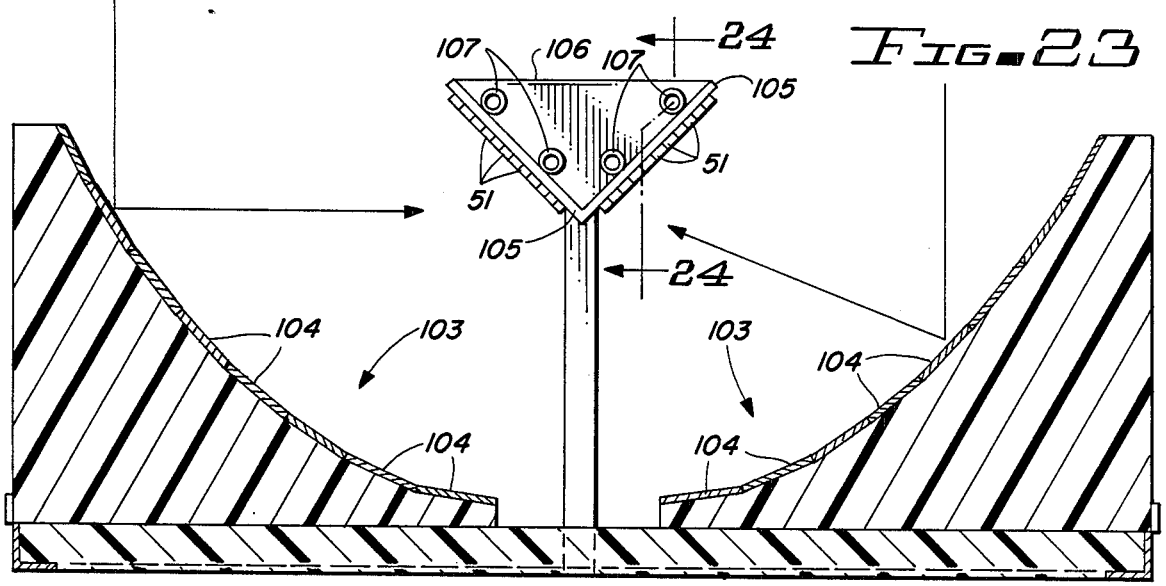
FIG. 23 is a cross-sectional view of FIG. 22 taken along the line 23—23.
Figure 24:
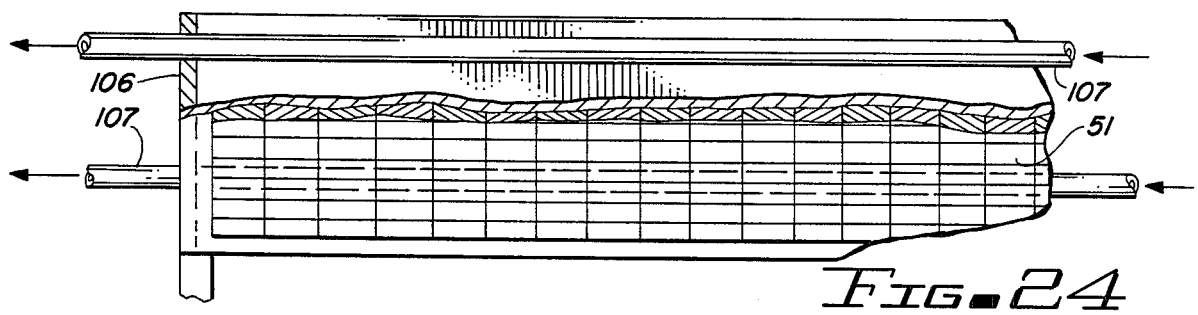
FIG. 24 is a cross-sectional view of FIG. 23 taken along the line 23—23.

FIGS. 22-24 disclose a still further modification of the inventive concept disclosed herein wherein a collector 102 may be formed of a water floatable foam plastic material configured to form an arcuate or parabolic surface 103 as shown. The arcuate surface may be covered with a plurality of mirrors 104, such as flat segments of 3/32 inch back surface mirrors. The mirror segments are arranged to reflect the solar rays onto the outside bottom surface 105 of a V-shaped trough 106 of the type shown in FIG. 16. The width of each mirror can be set to reflect a beam of sunlight across the entire receiver, thus assuring uniform distribution of light to maximize production of electricity from photovoltaic cells. This uniformity is not available in the standard parabolic reflector. The bottom surface of trough 105 is covered with panels of water cooled photovoltaic cells 51. The cells are cooled by water conducting copper pipes 107 positioned within the V-shaped trough 106, as shown. The trough is positioned within the focal center of the arcuate configuration in a known manner.

Collector 102 may be formed in modules which may be individually or collectively arranged in gangs floated on a body of water. The integrated gang of collectors may be pivotally mounted about a common axis for azimuth tracking purposes.

Although but a few embodiments of the invention have been illustrated and described, it will be apparent to those skilled in the art that various changes and modifications may be made therein without departing from the spirit of the invention or from the scope of the appended claims.

What is claimed is:

1. A heat exchange means comprising:
a floating structure,
means for positioning said structure for circular movement through a given path when floating on a liquid,
a plurality of altitude tracking arrays of juxtapositioned lenses, each mounted on the top of said structure, the lenses of each array receiving solar rays,
at least one solar ray collector panel provided with a plurality of photovoltaic cells mounted adjacent each array and disposed with its axis in the focal zone of said lenses of the associated array, and
actuating means for moving said structure about a circular path for tracking the sun in an azimuth mode,
said array of lenses comprising pairs of similar lenses, one arranged on each side of an associated collector panel for directing the solar rays toward the collector panel in a direction away from the sun,
said floating structure comprising a plurality of individual floating panels each supporting at least one array of said lenses and interconnected to form a spaced array of floating panels,
said floating structure comprising at least one arcuate shaped trough having a plurality of ballest spacedly positioned to extend longitudinally of its length for controlling its pivotal movement in an altitude tracking mode,
said floating panels being hingedly mounted on said floating structure, and
said altitude tracking array of lenses comprising at least one rod pivotally moving said floating panels in unison in a reciprocal manner.

* * * * *